United States Patent
Liu et al.

(10) Patent No.: US 11,536,427 B2
(45) Date of Patent: Dec. 27, 2022

(54) CEILING LAMP, LED LIGHT SOURCE MODULE, AND LIGHT SOURCE ASSEMBLY

(71) Applicants: OPPLE LIGHTING CO., LTD., Shanghai (CN); SUZHOU OPPLE LIGHTING CO., LTD., Suzhou (CN)

(72) Inventors: Zeyu Liu, Shanghai (CN); Yisheng Xiao, Shanghai (CN)

(73) Assignees: Opple Lighting Co., Ltd., Shanghai (CN); Suzhou Opple Lighting Co., Ltd., Jiangsu (CN)

( * ) Notice: Subject to any disclaimer, the term of this patent is extended or adjusted under 35 U.S.C. 154(b) by 0 days.

(21) Appl. No.: 17/362,758

(22) Filed: Jun. 29, 2021

(65) Prior Publication Data

US 2021/0325013 A1    Oct. 21, 2021

Related U.S. Application Data

(63) Continuation of application No. PCT/CN2019/128266, filed on Dec. 25, 2019.

(30) Foreign Application Priority Data

Dec. 29, 2018 (CN) .................. 201822277574.X

(51) Int. Cl.
*F21S 8/04* (2006.01)
*F21V 29/70* (2015.01)
(Continued)

(52) U.S. Cl.
CPC ............ *F21S 8/046* (2013.01); *F21V 5/04* (2013.01); *F21V 23/005* (2013.01); *F21V 29/70* (2015.01); *F21V 29/87* (2015.01); *F21Y 2115/10* (2016.08)

(58) Field of Classification Search
CPC .. F21S 8/046; F21S 8/04; F21V 29/87; F21V 5/04; F21V 23/05; F21V 29/70–717; F21V 29/502; F21V 29/503; F21V 29/508
See application file for complete search history.

(56) References Cited

U.S. PATENT DOCUMENTS

2015/0049497 A1    2/2015  Wang et al.
2018/0252369 A1*   9/2018  Cao ......................... F21K 9/90

FOREIGN PATENT DOCUMENTS

CN    104315434 A    1/2015
CN    204268400 U    4/2015
(Continued)

OTHER PUBLICATIONS

International Search Report of PCT Application No. PCT/CN2019/128266 dated Mar. 26, 2020 with English translation, (6p).
(Continued)

*Primary Examiner* — Anabel Ton
(74) *Attorney, Agent, or Firm* — Arch & Lake LLP

(57) ABSTRACT

A ceiling lamp, an LED light source module, and a light source assembly are provided. The light source assembly includes a plastic heat-dissipating member and a metal substrate for mounting LED light sources of the ceiling lamp. The plastic heat-dissipating member includes an embedding groove, and the metal substrate is embedded in the embedding groove and is in contact with groove walls of the embedding groove. The light source assembly can effectively balance safety, performance and cost.

20 Claims, 4 Drawing Sheets

(51) Int. Cl.
*F21V 29/87* (2015.01)
*F21V 5/04* (2006.01)
*F21V 23/00* (2015.01)
*F21Y 115/10* (2016.01)

(56) References Cited

FOREIGN PATENT DOCUMENTS

| | | |
|---|---|---|
| CN | 205447505 U | 8/2016 |
| CN | 207262085 U | 4/2018 |
| CN | 207936004 U | 10/2018 |
| CN | 108758467 A | 11/2018 |
| CN | 209101141 U | 7/2019 |
| EP | 2806209 A1 | 11/2014 |
| IN | 202147027483 A | 2/2021 |
| KR | 101763692 B1 | 8/2017 |

OTHER PUBLICATIONS

Extended European Search Report of EP Application No. 19903743.3 dated Jan. 7, 2022, (8p).
Notification of European Publication Number Issued in EP Application No. 19903743.3 dated Sep. 1, 2021, (2p).

* cited by examiner

CEILING LAMP, LED LIGHT SOURCE MODULE, AND LIGHT SOURCE ASSEMBLY

CROSS-REFERENCE TO RELATED APPLICATIONS

This application is a continuation of PCT patent application No. PCT/CN2019/128266 filed on Dec. 25, 2019 which claims priority to the Chinese patent application No. 201822277574.X filed on Dec. 29, 2018, the entire contents of both of which are hereby incorporated by reference for all purposes.

TECHNICAL FIELD

The present disclosure relates to the technical field of lighting, and in particular, to a light source assembly for a ceiling lamp, an LED light source module, and a ceiling lamp.

BACKGROUND

A light source assembly for a ceiling lamp emerged in recent two years in an old lamp transformation field as an upcycling solution relatively high in cost performance. By simply changing a light source instead of changing an original decoration style or a lamp, an old fluorescent lamp can be transformed into an LED lamp, which is simple and convenient, and accordingly cost is low and resources are saved.

As ceiling lamps were broadly accepted by customers, a problem occurred: with the increase of demand, more and more manufacturers emerged to market unsafe products with low input without considering too much. Considering safety of products, some law-abiding manufacturers use resin circuit boards relatively low in heat conductivity. However, heat, if excessive, may affect the service life of a light source assembly. In order to dissipate extra heat, a use area of a resin PCB needs to be increased, a wiring area may accordingly be increased, and this results in a large increase of cost. Consequently, an existing light source assembly fails to effectively balance safety, performance and cost.

SUMMARY

Embodiments of the disclosure provide a light source assembly for a ceiling lamp for solving the problem of failing to effectively balance safety, performance and cost in the prior art.

In a first aspect, a light source assembly is provided in the disclosure. The light source assembly may include a plastic heat-dissipating member and a metal substrate for mounting an LED light source of a ceiling lamp, where the plastic heat-dissipating member comprises an embedding groove, and the metal substrate is embedded in the embedding groove and is in contact with a groove wall of the embedding groove.

In a second aspect, a light source module is provided, where the light source module includes the light source assembly in the first aspect and a LED light source disposed on the metal substrate.

In a third aspect, a ceiling lamp is provided in the disclosure. The ceiling lamp includes a light source assembly that includes a plastic heat-dissipating member and a metal substrate for mounting an LED light source of a ceiling lamp; a LED light source disposed on the metal substrate; and a driving power source disposed on the plastic heat-dissipating member. The plastic heat-dissipating member comprises an embedding groove. The metal substrate is embedded in the embedding groove and is the metal substrate in contact with a groove wall of the embedding groove.

It is to be understood that both the foregoing general description and the following detailed description are exemplary and explanatory only and are not restrictive of the present disclosure.

BRIEF DESCRIPTION OF THE DRAWINGS

The accompanying drawings as described below are intended to provide a further understanding of the present disclosure and are incorporated in and constitute a part of the present disclosure. Illustrative embodiments of the present disclosure and description thereof serve to explain the present disclosure and are not to be construed as unduly limiting the present disclosure. In the drawings.

DETAILED DESCRIPTION

Figure 1:
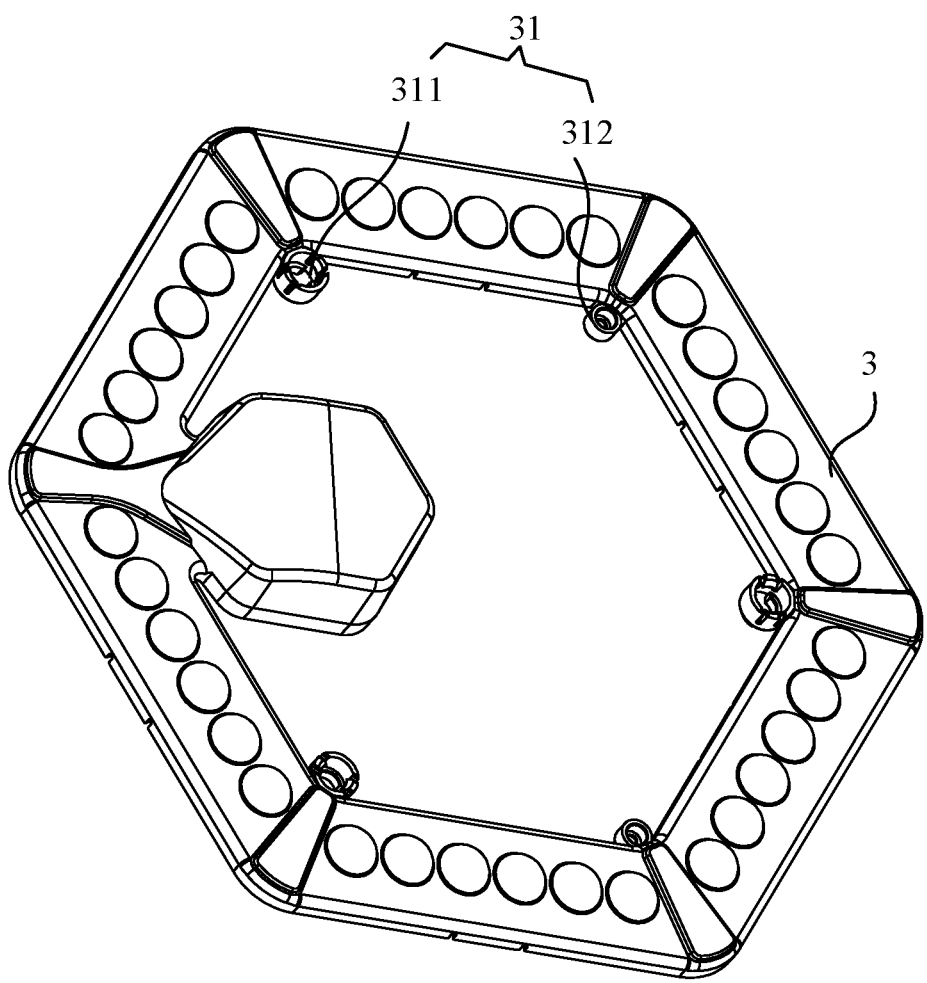
FIG. 1 is a structural schematic diagram of a lighting lamp provided by an embodiment of the present disclosure.

In order to make objects, technical details and advantages of the disclosure clearer, the technical solutions of the disclosure will be described in a clearly and fully understandable way with reference to specific embodiments of the disclosure and corresponding drawings. Obviously, the described embodiments are only a part of the embodiments of the disclosure, but not all the embodiments. Based on the embodiments in the disclosure, all other embodiments obtained by those skilled in the art without inventive work labor should belong to the scope of the disclosure.

The terms used in the disclosure are for the purpose of describing particular examples only, and are not intended to limit the disclosure. "A/an", "the" and "this" in a singular form in the disclosure and the appended claims are also intended to include a plural form, unless other meanings are clearly denoted throughout the disclosure. It should also be understood that term "and/or" used in the disclosure refers to and includes one or any or all possible combinations of multiple associated items that are listed.

Reference throughout this specification to "one embodiment," "an embodiment," "an example," "some embodiments," "some examples," or similar language means that a particular feature, structure, or characteristic described is included in at least one embodiment or example. Features, structures, elements, or characteristics described in connection with one or some embodiments are also applicable to other embodiments, unless expressly specified otherwise.

It should be understood that although the terms first, second, third, etc. may be used in the disclosure to describe various information, such information should not be limited to these terms. These terms are only used to distinguish the same type of information from each other. For example, without departing from the scope of the disclosure, first information may also be called second information and, similarly, second information may also be called first information. For example, term "if" used here may be explained as "while" or "when" or "responsive to determining", which depends on the context.

The following reference numerals are included in FIG. 1 to FIG. 4:

Light source assembly—100; LED light source—200; Metal substrate—1; Plastic heat-dissipating member—2; Upper cover—3; Flexible circuit board—11; Metal strip plate—12; Embedding groove—21; Operation groove—22; Mounting part—23; Mounting part—31; Adsorption member mounting hole—311; and Screw mounting hole—312.

Figure 2:
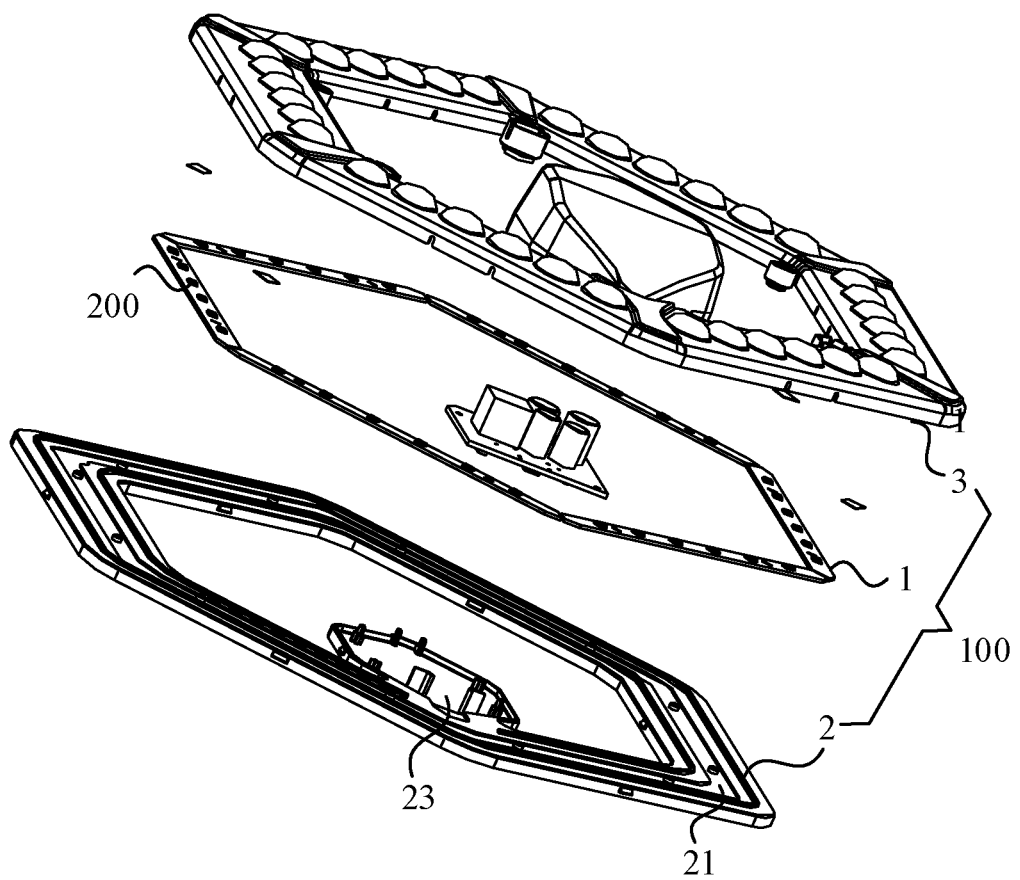
FIG. 2 is an exploded schematic diagram of a lighting lamp provided by an embodiment of the present disclosure.
Figure 3:
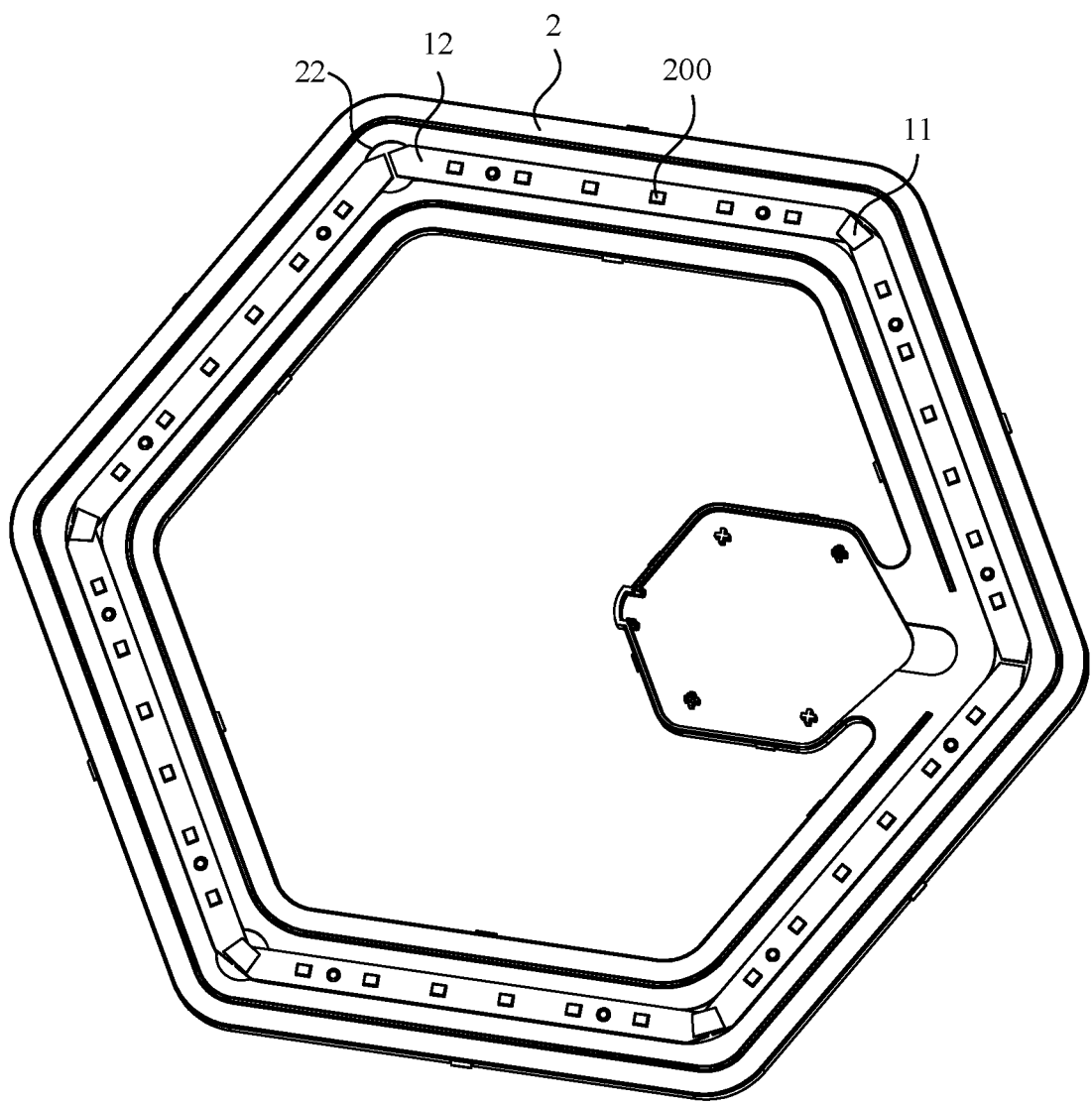
FIG. 3 is a structural schematic diagram of a lighting lamp without an upper cover provided by an embodiment of the present disclosure.

A light source assembly of the present disclosure is applied to a ceiling lamp. As shown in FIG. 1 to FIG. 3, the light source assembly 100 includes a metal substrate 1 and a plastic heat-dissipating member 2. LED light sources 200 of the ceiling lamp are disposed on the metal substrate 1. The plastic heat-dissipating member 2 includes an embedding groove 21. The embedding groove 21 includes a bottom wall and a side wall. The metal substrate 1 is embedded in the embedding groove 21. The metal substrate 1 is in contact with the groove walls of the embedding groove 21.

In the light source assembly 100, the plastic heat-dissipating member 2 can ensure safety of the light source assembly 100. The metal substrate 1 and the plastic heat-dissipating member 2 can effectively dissipate heat, thereby ensuring performance of the light source assembly 100. On the premise of effectively ensuring a heat dissipation effect of the metal substrate 1 and the plastic heat-dissipating member 2, the LED light sources 200 can have a relatively compact layout. There is no need to enlarge the metal substrate 1 and the plastic heat-dissipating member 2 or perform additional wiring, so as to reduce cost of the light source assembly 100. Consequently, the light source assembly 100 can effectively balance safety, performance and cost.

The metal substrate 1 includes a flexible circuit board 11 and a plurality of metal strip plates 12. The LED light sources 200 are disposed on the metal strip plates 12. The flexible circuit board 11 may be provided with the LED light sources 200 to supplement and uniformize lighting at corners and may also be provided with no LED light sources 200. A material of each metal strip plate 12 may be aluminum. Each metal strip plate 12 is in a long strip shape extending linearly. The metal strip plates 12 are arrayed in sequence. Two adjacent metal strip plates 12 form an included angle therebetween. The metal strip plates 12 define a polygonal ring structure, e.g., a triangular ring structure and a pentagonal ring structure. The metal strip plates 12 are embedded in the embedding groove 21, with front sides facing upwards. The LED light sources 200 are disposed on the front sides of the metal strip plates 12. The two ends of the front side of each metal strip plate 12 are provided with copper foils, respectively.

The flexible circuit board 11 is connected to the adjacent metal strip plates 12. Flexible circuit boards 11 in all light source assemblies 100 may be integrally machined and then cut into a plurality of flexible circuit boards 11 with desired shapes. After the flexible circuit board 11 of a desired shape is cut, the two sides of the flexible circuit board 11 are provided with copper foils. The flexible circuit board 11 is welded to the front sides of the metal strip plates 12 through the copper foils.

The two ends of the metal strip plate 12 may be beveled. Two adjacent metal strip plates 12 are in contact or a relatively small gap (e.g., about 1 mm) is reserved therebetween. The flexible circuit board 11 is supported by the metal strip plates 12 after being welded to the metal strip plates 12, so as not to deform to be disengaged from the metal strip plates 12.

Plastic of the plastic heat-dissipating member 2 is the same as ordinary plastic, i.e., a high-molecular compound formed by addition polymerization or condensation polymerization. The plastic heat-dissipating member 2 is substantially of an integrated polygonal ring structure. A circle of embedding groove 21 is formed in the plastic heat-dissipating member 2. Each side of the embedding groove 21 is provided with one metal strip plate 12.

The plastic heat-dissipating member 2 is further provided with operation grooves 22. The operation grooves 22 are connected to the embedding groove 21. The metal substrate 1 is taken and placed through the operation grooves 22. The operation grooves 22 may be positioned at corner positions of the embedding groove 21 (or positions for forming the included angle by two metal strip plates 12). A lateral side of each metal strip plate 12 may be flush with a lateral side of the flexible circuit board 11 or protrudes out of the flexible circuit board 11. After the metal substrate 1 is placed into the embedding groove 21, the metal strip plates 12 are exposed in the operation grooves 22. Therefore, the metal substrate 1 may be taken or placed by touching two metal strip plates 12 at the same time, and the probability of deformation failure of the metal substrate 1 is reduced.

An inner side of the plastic heat-dissipating member 2 may be provided with an accommodating groove 23 connected to the embedding groove 21. A driving power source of the ceiling lamp is mounted in the accommodating groove 23, so as to facilitate mounting a driving circuit.

Figure 4:
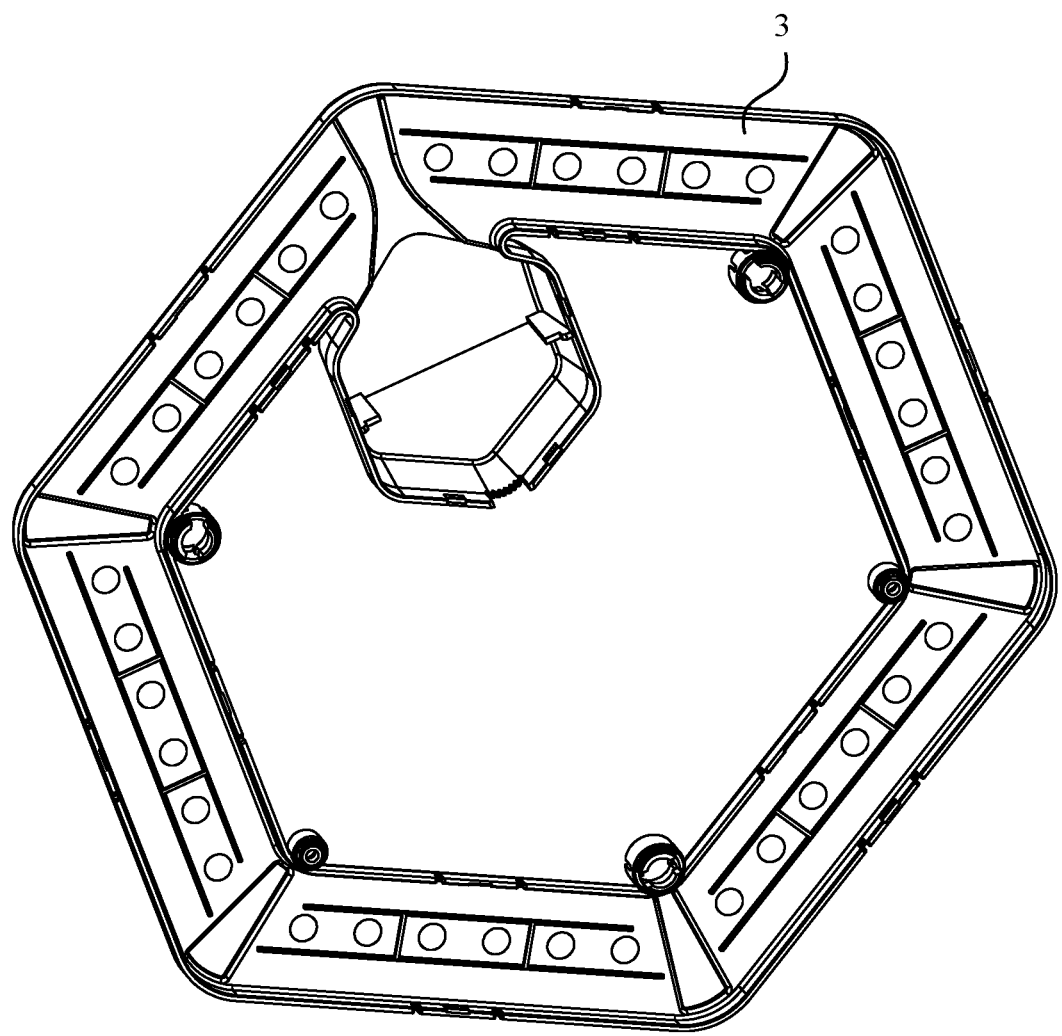
FIG. 4 is a structural schematic diagram of a back side of an upper cover of an embodiment of the present disclosure.

As shown in FIG. 1 and FIG. 4, the light source assembly 100 further includes an upper cover 3 buckled on the plastic heat-dissipating member 2 through buckles. The upper cover 3 is in substantially the same shape as the plastic heat-dissipating member 2 and is of an annular integrated structure. A lateral side of the upper cover 3 may wrap a lateral side of the plastic heat-dissipating member 2. The upper cover 3 in the meantime covers the accommodating groove 23 of the plastic heat-dissipating member 2, so as to further improve safety. The upper cover 3 may be an optical member, e.g., a lens. The optical member may be set in various ways, e.g., the optical member is provided with a plurality of lens units, the lens units protrude from the upper surface of the optical member and are distributed at intervals to form an annulus, and the lens units correspond to the LED light sources one to one, so as to conveniently distribute light. Or, the optical member may further be provided with an annular integrally-extending lens part, and the lens part protrudes from the upper surface of the optical member and is configured to have hyperboloid, so as to further conveniently distribute light.

A mounting part 31 may be disposed on an inner side or an outer side of the upper cover 3. A mounting member is fixed in the mounting part 31. The light source assembly 100 is fixed to a base plate of the ceiling lamp through the mounting member. Preferably, the mounting part 31 is selected to be disposed on the inner side of the upper cover 3, so as to reduce an area occupied by an optical assembly. The mounting part 31 may be a mounting hole. The mounting hole includes an adsorption member mounting hole 311 and a screw mounting hole 312. When the mounting member is an adsorption member (e.g., a magnet), the adsorption member is fixed in the adsorption member mounting hole 311 through buckles or fixing screws. When the mounting member is a screw, the adsorption member is fixed in the screw mounting hole 312 through buckles or fixing screws.

As the mounting part 31 is disposed in this way, the structure is simple, and mounting is easy.

An LED light source module of the present disclosure is applied to the ceiling lamp. The LED light source 200 module includes the light source assembly 100 described above and the LED light sources 200 disposed on the metal substrate 1. In the LED light source 200 module, the plastic heat-dissipating member 2 may ensure safety of the light source assembly 100. The metal substrate 1 and the plastic heat-dissipating member 2 may effectively dissipate heat, thereby ensuring performance of the light source assembly 100. On the premise of effectively ensuring a heat dissipation effect of the metal substrate 1 and the plastic heat-dissipating member 2, the LED light sources 200 may have a relatively compact layout. There is no need to enlarge the metal substrate 1 and the plastic heat-dissipating member 2, so as to reduce cost of the light source assembly 100. Consequently, the light source assembly 100 may effectively balance safety, performance and cost.

The ceiling lamp of the present disclosure includes the light source assembly 100 described above, the LED light sources 200 disposed on the metal substrate 1, and a driving power source disposed on the plastic heat-dissipating member 2. The driving power source is specifically disposed in the accommodating groove 23 of the plastic heat-dissipating member 2. In the ceiling lamp, the plastic heat-dissipating member 2 may ensure safety of the light source assembly 100. The metal substrate 1 and the plastic heat-dissipating member 2 may effectively dissipate heat, thereby ensuring performance of the light source assembly 100. On the premise of effectively ensuring a heat dissipation effect of the metal substrate 1 and the plastic heat-dissipating member 2, the LED light sources 200 may have a relatively compact layout. There is no need to enlarge the metal substrate 1 and the plastic heat-dissipating member 2, so as to reduce cost of the light source assembly 100. Consequently, the light source assembly 100 may effectively balance safety, performance and cost.

Optionally, the metal substrate comprises a flexible circuit board and a plurality of metal strip plates disposed in the embedding groove in sequence, two adjacent metal strip plates form an included angle therebetween and are connected with each other through the flexible circuit board, and the LED light source is disposed on front sides of the metal strip plates.

Optionally, the flexible circuit board is disposed on the front sides of the metal strip plates, and the metal strip plates support the flexible circuit board.

Optionally, the plastic heat-dissipating member further comprises operation grooves communicating with the embedding groove, and the operation grooves are located on two sides of the metal substrate.

Optionally, the operation grooves are located at positions for forming the included angle by two metal strip plates.

Optionally, the metal strip plates are exposed in the operation grooves.

Optionally, the light source assembly further comprises an upper cover buckled on the plastic heat-dissipating member.

Optionally, the plastic heat-dissipating member is of an annular integrated structure, the upper cover is an annular integrated optical member, the optical member is provided with a plurality of lens units, the lens units protrude from the upper surface of the optical member and are distributed at intervals to form an annulus, or the optical member is provided with an annular integrally-extending lens part, and the lens part protrudes from the upper surface of the optical member and is configured to have hyperboloid.

Optionally, an inner side of the plastic heat-dissipating member is provided with an accommodating groove connected to the embedding groove, the accommodating groove is configured to accommodate a driving power source of the ceiling lamp, and the upper cover covers the accommodating groove.

Optionally, the upper cover is further provided with a mounting part for arranging a mounting member, and the light source assembly is fixed through the mounting member.

Optionally, the mounting member is an adsorption member or a screw, the adsorption member is assembled on the mounting part through a buckle or a fixing screw, the mounting part is a mounting hole located at an inner side or an outer side of the upper cover, and the mounting hole comprises a mounting hole for mounting the adsorption member and a mounting hole for mounting the screw.

An LED light source module provided in the disclosure comprises the light source assembly and the LED light source disposed on the metal substrate.

A ceiling lamp provided in the disclosure comprises the light source assembly, the LED light source disposed on the metal substrate, and a driving power source disposed on the plastic heat-dissipating member.

The following beneficial effects can be obtained through at least one of the above mentioned technical solutions according to the embodiments of the disclosure.

The metal substrate and the plastic heat-dissipating member are provided, and the plastic heat-dissipating member can ensure safety of the light source assembly. The metal substrate and the plastic heat-dissipating member can effectively dissipate heat, thereby ensuring performance of the light source assembly. On the premise of effectively ensuring a heat dissipation effect of the metal substrate and the plastic heat-dissipating member, the LED light sources can have a relatively compact layout. There is no need to enlarge the metal substrate and the plastic heat-dissipating member or perform additional wiring, so as to reduce cost of the light source assembly. Consequently, the light source assembly can effectively balance safety, performance and cost.

The above only describes embodiments of the present disclosure, but not intended to limit the present disclosure. It will be apparent to those skilled in the art that various modifications and variations can be made to the present disclosure. The modifications, equivalent replacements, improvements and the like made within the spirit and principle of the present disclosure shall be all included in the scope defined by the claims of the present disclosure.

The invention claimed is:

1. A light source assembly, comprising:
a plastic heat-dissipating member and a metal substrate for mounting a light emitting diode (LED) light source of a ceiling lamp,
wherein the plastic heat-dissipating member comprises an embedding groove,
wherein the metal substrate is embedded in the embedding groove and the metal substrate is in contact with a groove wall of the embedding groove,
wherein the LED light source is disposed on the metal substrate, and
wherein the metal substrate comprises a flexible circuit board and a plurality of metal strip plates disposed in the embedding groove in sequence, and two adjacent metal strip plates are connected with each other through the flexible circuit board.

2. The light source assembly for the ceiling lamp according to claim 1, wherein the two adjacent metal strip plates form an included angle therebetween, and the LED light source is disposed on front sides of the metal strip plates.

3. The light source assembly for the ceiling lamp according to claim 2, wherein the flexible circuit board is disposed on the front sides of the metal strip plates, and the metal strip plates support the flexible circuit board.

4. The light source assembly for the ceiling lamp according to claim 2, wherein the plastic heat-dissipating member further comprises operation grooves communicating with the embedding groove, and the operation grooves are located on two sides of the metal substrate.

5. The light source assembly for the ceiling lamp according to claim 4, wherein the operation grooves are located at positions for forming the included angle by two metal strip plates.

6. The light source assembly for the ceiling lamp according to claim 5, wherein the metal strip plates are exposed in the operation grooves.

7. The light source assembly for the ceiling lamp according to claim 4, further comprising an upper cover buckled on the plastic heat-dissipating member.

8. The light source assembly for the ceiling lamp according to claim 7, wherein the plastic heat-dissipating member is of an annular integrated structure, the upper cover is an annular integrated optical member, the optical member is provided with a plurality of lens units, the lens units protrude from the upper surface of the optical member and are distributed at intervals to form an annulus, or the optical member is provided with an annular integrally-extending lens part, and the lens part protrudes from the upper surface of the optical member and is configured to have hyperboloid.

9. The light source assembly for the ceiling lamp according to claim 8, wherein an inner side of the plastic heat-dissipating member is provided with an accommodating groove connected to the embedding groove, the accommodating groove is configured to accommodate a driving power source of the ceiling lamp, and the upper cover covers the accommodating groove.

10. The light source assembly for the ceiling lamp according to claim 8, wherein the upper cover is further provided with a mounting part for arranging a mounting member.

11. The light source assembly for the ceiling lamp according to claim 10, wherein
the mounting part is a mounting hole located at an inner side or an outer side of the upper cover.

12. A light source module, comprising:
a light source assembly that comprises a plastic heat-dissipating member and a metal substrate for mounting a light emitting diode (LED) light source of a ceiling lamp; and
a LED light source disposed on the metal substrate,
wherein the plastic heat-dissipating member comprises an embedding groove,
wherein the metal substrate is embedded in the embedding groove and the metal substrate is in contact with a groove wall of the embedding groove, and
wherein the metal substrate comprises a flexible circuit board and a plurality of metal strip plates disposed in the embedding groove in sequence, and two adjacent metal strip plates are connected with each other through the flexible circuit board.

13. The light source module according to claim 12, wherein the two adjacent metal strip plates form an included angle therebetween, and the LED light source is disposed on front sides of the metal strip plates.

14. The light source module according to claim 13, wherein the flexible circuit board is disposed on the front sides of the metal strip plates, and the metal strip plates support the flexible circuit board.

15. The light source module according to claim 13, wherein the plastic heat-dissipating member further comprises operation grooves communicating with the embedding groove, and the operation grooves are located on two sides of the metal substrate.

16. The light source module according to claim 15, wherein the operation grooves are located at positions for forming the included angle by two metal strip plates.

17. The light source module according to claim 16, wherein the metal strip plates are exposed in the operation grooves.

18. The light source module according to claim 15, further comprising an upper cover buckled on the plastic heat-dissipating member.

19. The light source module according to claim 18, wherein the plastic heat-dissipating member is of an annular integrated structure, the upper cover is an annular integrated optical member, the optical member is provided with a plurality of lens units, the lens units protrude from the upper surface of the optical member and are distributed at intervals to form an annulus, or the optical member is provided with an annular integrally-extending lens part, and the lens part protrudes from the upper surface of the optical member and is configured to have hyperboloid.

20. A ceiling lamp, comprising:
a light source assembly that comprises a plastic heat-dissipating member and a metal substrate for mounting a light emitting diode (LED) light source of a ceiling lamp;
a LED light source disposed on the metal substrate; and
a driving power source disposed on the plastic heat-dissipating member,
wherein the plastic heat-dissipating member comprises an embedding groove,
wherein the metal substrate is embedded in the embedding groove and the metal substrate is in contact with a groove wall of the embedding groove, and
wherein the metal substrate comprises a flexible circuit board and a plurality of metal strip plates disposed in the embedding groove in sequence, and two adjacent metal strip plates are connected with each other through the flexible circuit board.

* * * * *